April 19, 1960 A. H. MACISZEWSKI ET AL 2,933,698

TEMPERATURE COMPENSATED VARIABLE FREQUENCY OSCILLATOR

Original Filed May 13, 1954

Inventors
Arthur H. Maciszewski
Julius J. Hupert
Richard Goldstein
Tadeusz Szubski
by Smith, Frangley, Baird & Clayton Attys.

2,933,698
Patented Apr. 19, 1960

2,933,698

TEMPERATURE COMPENSATED VARIABLE FREQUENCY OSCILLATOR

Arthur H. Maciszewski, Julius J. Hupert, Richard Goldstein, and Tadeusz Szubski, all of River Forest, Ill., assignors to A.R.F. Products, Inc., River Forest, Ill., a corporation of Illinois Original application May 13, 1954, Serial No. 429,547, now Patent No. 2,881,315, dated April 7, 1959. Divided and this application April 21, 1958, Serial No. 729,826

6 Claims. (Cl. 331—176)

Figures 1, 2:
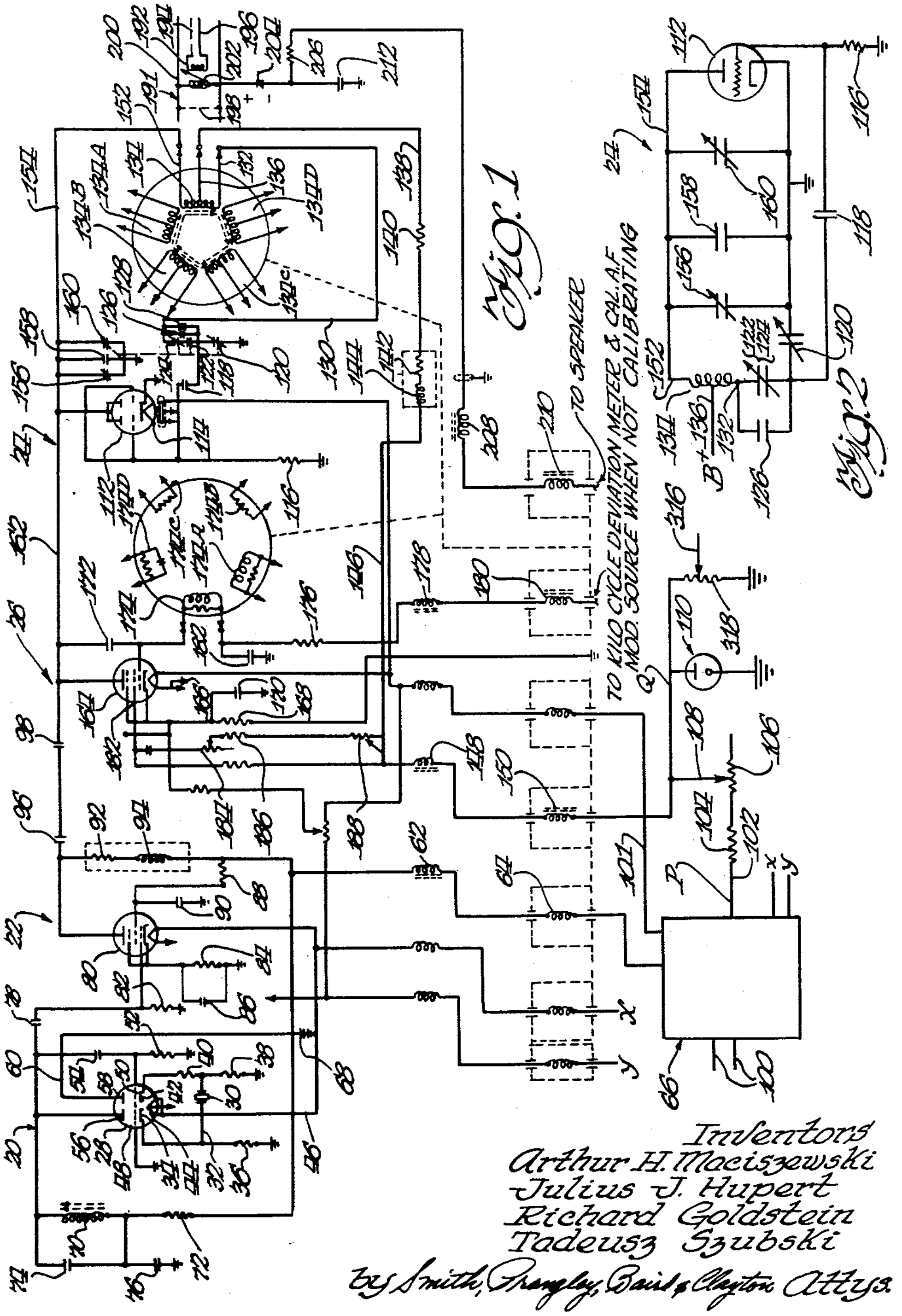

This invention relates to signal generators and circuits therefor and particularly to calibrated signal generators and circuits therefor useful in testing electronic equipment.

One of the principal uses of electronic equipment made according to the present invention is the production of a radio frequency signal having a known and well regulated frequency. Two common sources of error or causes of deviation in the frequency of such radio frequency sources are changes in temperature and variations in the A.C. line voltage which supplies the power for the various power connections to the oscillator and associated circuits.

Accordingly, it is an important object of this invention to provide an improved means for compensating circuit changes caused by changes in temperature and particularly to provide an improved circuit for stabilizing the frequency of capacity tuned radio frequency oscillators.

In connection with the foregoing object, it is a further object of this invention to provide in such radio frequency oscillators complete two-point compensation of the frequency-temperature characteristic of the oscillator so that proper compensation is obtained in both low and high frequencies.

These and other objects and advantages of the invention are achieved by the signal generator illustrated in the accompanying drawing. In the drawings wherein like reference numerals have been used to designate like parts throughout:

Fig. 1 is a circuit diagram, part diagrammatic, of the variable radio frequency oscillator of this invention and its connection with the reactor tube, the calibration oscillator, and the radio frequency output attenuator; and Fig. 2 is a simplified circuit diagram of the temperature compensating circuit for stabilizing the frequency of the variable radio frequency oscillator.

Referring now to the drawings and particularly to Fig. 1 there is shown the calibrated radio frequency section of the signal generator made according to and incorporating the principles of the present invention. The calibrated radio frequency section of the signal generator comprises generally a calibrating oscillator 20, a harmonic generator and amplifier 22, a variable radio frequency oscillator 24 and a modulating or reactor tube circuit 26. In general the purpose of the calibrating oscillator 20 is to generate an accurate radio frequency operating at a given fundamental frequency such as, for example, two megacycles, this frequency being calibrated and controlled to a high degree of accuracy. The output of the calibrating oscillator 20 is then fed to the harmonic generator and amplifier 22 which generates harmonics of the fundamental frequency of two megacycles and amplifies these harmonic frequencies as well as the fundamental frequency to provide calibrating reference signals.

The oscillator 24 is continually variable over a specified range and as illustrated has five separate ranges over which the frequency is continually variable. It is oscillator 24 which will provide the working signal to be used in testing and calibrating other electronic equipment. The output of the variable radio frequency oscillator 24 and the output of the harmonic amplifier 22 are each fed to the reactor tube circuit 26 and there beat against each other. The output of the reactor tube circuit 26 is fed to a deviation meter or to a speaker so that the difference between the variable oscillator frequency and the appropriate calibrating signal can be detected and adjusted to zero at which time the frequency of the variable oscillator 24 can be said to be calibrated.

Each element of the above radio frequency generating and calibrating circuit will now be discussed in detail.

Referring first to the calibrating oscillator 20, this oscillator includes a duo-triode 28 whose operation is controlled by a crystal 30. Although any suitable frequency of crystal 30 may be utilized, a crystal operating at a frequency of two megacycles is preferred. A crystal operating at two megacycles permits one megacycle beat nulls to be generated with the use of a minimum of harmonics of the fundamental operating frequency of crystal 30. One of the terminals of crystal 30 is connected through a lead 32 to one of the cathodes 34 of tube 28 which is preferably a type 12AU7, and through a resistor 36 (820 ohms) to ground. The other terminal of crystal 30 is connected through a resistor 38 (820 ohms) to ground and through a resistor 40 (820 ohms) to the other cathode 42 of tube 28. The cathodes 34 and 42 are heated by heaters 44 that are supplied with suitable power through line 46. One of the control grids 48 is grounded and the other control grid 50 is connected through a resistor 52 (4700 ohms) to ground and through a capacitor 54 (470 $\mu\mu$f.) to one of the plates 56 of tube 28. The other plate 58 of tube 28 is connected through a line 60, an inductance 62 (0.9 $\mu$h.) and a shielded inductance 64 (0.9 $\mu$h.) to a source 66 of high operating potential. A capacitor 68 (5000 $\mu\mu$f.) is connected from plate 58 to ground to filter out and prevent radio frequency oscillations from entering the power supply 66. Plate 56 is connected through a variable inductance 70 and a resistor 72 (1000 ohms) to line 60 whereby to provide a source of high operating potential for plate 56. There is provided in parallel with inductor 70 a capacitor 74 (150 $\mu\mu$f.) and the junction between inductance 70 and resistor 72 is connected to ground by another capacitor 76 (5000 $\mu\mu$f.).

The above described circuit operates as a radio frequency oscillator at two megacycles when inductor 70 is properly adjusted to produce a resonant circuit at two megacycles.

The output from the calibration oscillator 20 is fed through a coupling capacitor 78 (470 $\mu\mu$f.) from plate 56 to the first grid of a tube 80 which serves as the harmonic generator and amplifier for circuit 22. Tube 80 is preferably a pentode and may be for example a 6AH6 or any other pentode having similar characteristics. The input signal on the control grid of tube 80 is developed across resistor 82 connected from the grid to ground, this resistor having a value of 47,000 ohms. The third or suppressor grid of tube 80 is connected directly to the cathode and the cathode is provided with self bias through a resistor 84 (220 ohms) which is connected to ground and which has in parallel therewith a capacitor 86 (5000 $\mu\mu$f.). The second or screen grid is connected through a resistor 88 (47,000 ohms) to a source of operating potential through inductors 62 and 64 and is bypassed to ground by a capacitor 90 (5000 $\mu\mu$f.). The plate of tube 80 is connected through a resistor 92 in series with an inductor 94 which in turn is connected to a source of operating potential through an inductance 62 and 64. Resistor 92 preferably has a value of 400 ohms and inductor 94 is so chosen that the amplifier 92 has a by-pass from two megacycles to and through 28 megacycles but has a relatively sharp cut-off between 28 megacycles and 30 megacycles. This is assuming that the operating range of the variable frequency oscillator 24 is to be in the range from zero megacycles up to and including 28 megacycles. If the range of the variable frequency oscillator 24 is to be greater or less, the values of resistor 92 and inductor 94 are chosen accordingly. The sharp cut-off characteristics of these circuit elements serve to give more accurate calibration.

The output from amplifier 22 will consist of an accurately controlled signal at two megacycles and the harmonics thereof up to and through the 14th harmonic which corresponds to 28 megacycles. The 15th harmonic and higher harmonics will be suppressed. The output of the amplifier 22 is fed through a pair of series coupling capacitors 96 (10 $\mu\mu$f.) and 98 (1 $\mu\mu$f.) to the plate of the tube in reactor circuit 26.

All of the operating potential for the tubes 28 and 80 and for the tubes in the oscillator circuit 24 and the reactor circuit 26 are supplied from the power supply or source generally designated by the numeral 66. The power supplied to power supply 66 is the usual 110 volts 60 cycle A.C. current which is supplied through a pair of lines 100 which will be hereafter referred to as the main supply line. The power supply 66, which is illustrated diagrammatically in Fig. 1, includes suitable transformers and rectifiers. One of the outputs of the power supply 66 is a non-regulated 6.3 volt heater supply, the terminals of which are indicated by the numerals "X" and "Y" and are the source of current for the cathode heaters described above. The inductor 64 is connected to an unregulated voltage point within power supply 66 for supplying relatively high operating potentials to the plates and grids of tubes 28 and 80. Another output from power supply 66 is a 6.7 volt heater supply 101 which is used to heat the filaments of the tubes in oscillator circuit 24 and reactor circuit 26.

One of the principal outputs of power supply 66 is an unregulated voltage appearing on line 102. Line 102 is connected to a resistor 104 (1600 ohms) which is in turn connected to a variable resistance 106 (1000 ohms). The movable arm 108 on the variable resistance 106 is connected to the plate of a voltage regulator tube 110 which may be of the type designated OA2. The voltage appearing on arm 108 serves as a regulated voltage supply for use on certain of the grids and the plates in the tubes of circuits 24 and 26.

The variable radio frequency oscillator 24 utilizes a duo-triode 112 which may be of the type designated 6J6. The cathode of tube 112 is heated by a filament 114 which is supplied with power from the low voltage supply 101. The cathode is grounded; the two control grids are connected to each other and the two plates are connected to each other. The grids are also connected to ground through a resistor 116 (33,000 ohms) and to a capacitor network which forms one of the tuning elements of the oscillator tank. More specifically, the grids are connected to a capacitor 118 (82 $\mu\mu$f.) which is in turn connected to a grounded variable capacitor 120 (12.4–77.6 $\mu\mu$f.), to a pair of variable capacitors 122 and 124 (having a combined capacitance of 8.0 to 66.8 $\mu\mu$f.), a capacitor 126 (2.1 $\mu\mu$f.) in parallel with capacitors 122 and 124 and a two section capacitor 128 (2.1 to 5.3 $\mu\mu$f. per section) which is in parallel with capacitor 126. The upper ends of capacitors 124 and 126 and 128 are connected to each other and through a line 130 to one terminal 132 of a variable inductance 134 which forms a portion of the tuned circuit of the oscillator 24. The oscillator circuit 24 has five separate ranges and accordingly five separate coils 134 having identical connections but different circuit values are provided. The center terminal 136 of coil 134 is connected through a line 138 to a resistor 140 (47 ohms) which is in turn connected to a resistance 142 (400 ohms) in series with an inductance 144. Inductance 144 is connected through a line 146, inductance 148 (14 $\mu$h.) and an inductance 150 (14 $\mu$h.) to the arm 108 on which appears the regulated high potential power supply.

The other terminal 152 of coil 134 is connected through a line 154 to the plate of tube 112 and accordingly the plate of tube 112 receives D.C. potential through the coil 134. The plate of tube 112 is also connected to ground through a series of three parallel capacitors, namely a variable capacitor 156 (1.7–8.7 $\mu\mu$f.), a fixed capacitor 158 (10 $\mu\mu$f.) and another variable capacitor 160 (9.2–17.2 $\mu\mu$f.).

Capacitors 120, 122, 124 and 160 are ganged together to maintain constant deviation sensitivity in the operation of the reactor tube 164 as the frequency of the oscillator 24 is varied, all of which explained in detail in applicants' copending application, Serial No. 429,547, filed May 13, 1954, Patent No. 2,881,315 granted April 7, 1959 for Multi-Band Compensated Oscillator. The described circuit 24 is operable to produce a continually variable frequency over a given range, there being several different individual ranges. More particularly, each coil 134 is adjustable to provide a continually varying frequency over a given specified range for the particular coil 134.

The output from the variable oscillator 24 is taken from the plate through a line 162 to the plate of a tube 164 in the reactor circuit 26. Tube 164 is preferably a 6AH6 pentode.

The cathode of tube 164 is heated by a filament 166 which is supplied with potential from the low voltage filament supply line 101. The third grid of the tube is connected directly to the cathode and the cathode is in turn connected to ground through a resistance 168 (100 ohms). Cathode bias is provided for tube 164 by providing resistance 168 with a by-pass capacitor 170 (800 $\mu\mu$f.).

The control grid of tube 164 is connected through a capacitor 172 (10 $\mu\mu$f.) to the plate of tube 164 and to the plate of tube 112 in the variable oscillator. The control grid of tube 164 is also connected to a suitable RL circuit generally designated by the numeral 174 which is in turn connected to a resistor 176 (470 ohms). Resistor 176 is connected to an inductance 178 (14 $\mu$h.) and an inductance (14 $\mu$h.) to a kilocycle deviation meter when calibrating and to a source of AF modulating voltage when desired. One end of resistance 176 is connected to ground through a capacitance 182 (470 $\mu\mu$f.).

Instead of the RL circuit 174, an RL circuit 174A, a resistance 174B, a resistance 174C, and a RC circuit 174D are provided for use on different frequency ranges. The various circuit elements 174—174D are ganged to the coils 134—134D so that these elements are automatically switched in both circuits when the frequency of oscillator frequency circuit 124 is changed.

The modulated or unmodulated output from the variable oscillator 24 is fed to a piece of electronic equipment to be tested by means of an output radio frequency attenuator generally designated by the numeral 191 in Fig. 1. The attenuator includes in general a pick-up coil 192, one end of which is grounded as at 194 and the other end 196 of which is connected to the electronic equipment to be tested. Coil 192 is inductively coupled to the coil 134 in the tank circuit 24. An electrostatic shield 198 is provided to prevent excitation of the pick-up loop or coil 192 by capacity coupling. The pick-up coil 192 is positioned within a metal tube 200 so that the tube and coil operate on the inductive-coupling mode as a wave guide below cutoff.

A pick-up loop or monitor wire 202 is provided, the monitor wire extending into the tube 200 and being positioned between the pick-up loop 192 and the electrostatic shield 198. The position of monitor loop 202 is adjustable. A connection is made from the monitor loop 202 through a rectifier 204, a resistance 206, an inductance 208 and a second inductance 210 to a speaker. A capacitor 212 by-passes resistance 206 to ground.

Referring now to Fig. 2 there is shown a simplified wiring diagram of certain portions of the variable oscillator 24, the details of which are shown in Fig. 1 described above. The simplified schematic drawing of Fig. 2 will be utilized to explain the manner in which compensation for temperature variations are made in the new improved circuit.

Usually the frequency determining circuit elements such as inductance 134, capacitors 122—124, and capacitors 120 and 160 have a positive thermal coefficient thereby causing a negative frequency coefficient. This positive thermal or temperature coefficient of the various frequency determining elements is counteracted in the present circuit by incorporating therein two capacitors having negative temperature coefficients. These added capacitors having negative temperature coefficients are capacitors 126 and 158. It will be seen from Fig. 2 that the contribution of capacitor 126 towards compensating for thermal deviations is highest at the higher operating frequencies. Conversely the contribution of capacitor 158 toward correcting temperature deviation is greatest at the low operating frequencies. Accordingly capacitors 126 and 158 are effective to provide adequate negative temperature coefficient contributions at both the high and low ends of the cooperating frequency range.

Capacitors 126 and 158 are preferably of a type using a ceramic dielectric, the dielectric material being chosen so that the capacitor has a negative temperature coefficient. In certain instances it may be found that the frequency contributing components of an oscillator circuit have a negative temperature coefficient. In such cases capacitors 126 and 158 would be chosen to provide positive temperature coefficient contributions.

This application is a division of the copending application Serial No. 429,547 filed May 13, 1954, for Multi-Band Compensated Oscillator, now Patent 2,881,315 issued April 7, 1959.

It will be seen that there has been provided a signal generator fulfilling all of the advantages and objects set forth above. Although certain specific examples and values of the circuit elements have been given for purposes of illustration, it is to be understood that various changes can be made therein without departing from the spirit and scope of the invention. Accordingly, the invention is to be limited only as set forth in the following claims.

We claim:

1. A temperature compensated variable frequency oscillator comprising an oscillator tube having a cathode and an anode, a variable frequency tuned series circuit including an inductance and a capacitance connected in series between said anode and said cathode to form an oscillator circuit, the frequency of said oscillator circuit normally changing in one direction when the temperature to which the oscillator circuit components are subjected increases, a first temperature compensating capacitor connected in parallel with a portion of the capacitance in said tuned circuit, and a second temperaure compensating capacitor interconnecting said anode and said cathode, one of said compensating capacitors compensating for temperature changes at relatively low operating frequencies and the other of said compensating capacitors compensating for temperature changes at relatively high operating frequencies.

2. A temperature compensated variable frequency oscillator comprising an oscillator tube including an anode and a cathode, a variable frequency tuned series circuit including an inductance and a capacitance connected in series between said anode and said cathode, the frequency of said oscillator normally decreasing when the temperature of the components thereof increases, a first temperature compensating capacitor connected in parallel with a portion of the capacitance in said tuned circuit, and a second temperature compensating capacitor connected between said anode and said cathode, each of said temperature compensating capacitors having a negative temperature coefficient of capacity.

3. A temperature compensated variable frequency oscillator tunable over a predetermined frequency range, comprising an oscillator tube having a cathode and an anode, a variable frequency tuned series circuit including an inductance and a main tuning capacitance tunable over said predetermined frequency range, said inductance and capacitance being connected in series between said anode and said cathode to form an oscillator circuit, the frequency of said oscillator circuit normally changing in one direction when the temperature to which said oscillator circuit components are subjected increases, a first temperature compensating capacitor connected in parallel with said main tuning capacitance in said tuned circuit, and a second temperature compensating capacitor interconnecting said anode and said cathode, one of said compensating capacitors compensating for temperature changes over the lower portion of said predetermined frequency range and the other of said compensating capacitors compensating for temperature changes over the upper portion of said predetermined frequency range.

4. A temperature compensated variable frequency oscillator tunable over a predetermined frequency range, comprising an oscillator tube having a cathode and an anode, a variable frequency tuned series circuit including an inductance and a main tuning capacitance tunable over said predetermined frequency range, said inductance and capacitance being connected in series between said anode and said cathode to form an oscillator circuit, the frequency of said oscillator circuit normally decreasing when the temperature to which the oscillator circuit components are subjected increases, a first temperature compensating capacitor connected in parallel with said main tuning capacitance in said tuned circuit, and a second temperature compensating capacitor interconnecting said anode and said cathode, each of said temperature compensating capacitors having a negative temperature coefficient of capacity, said first temperature compensating capacitor compensating for temperature changes over the upper portion of said predetermined frequency range and said second temperature compensating capacitor compensating for temperature changes over the lower portion of said predetermined frequency range.

5. A temperature compensated variable frequency oscillator tunable over a predetermined frequency range, comprising an oscillator tube having a cathode and an anode and a control grid, a variable frequency tuned series circuit including an inductance and a main tuning capacitance tunable over said predetermined frequency range and a compensating capacitance, said inductance and said capacitances being connected in series in the order named between said anode and said cathode to form an oscillator circuit, a coupling capacitance connecting said control grid to the junction between said tuning capacitance and said compensating capacitance, the frequency of said oscillator circuit normally changing in one direction when the temperature to which the oscillator circuit components are subjected increases, a first fixed temperature compensating capacitor connected in parallel with said main tuning capacitance in said tuned circuit, and a second fixed temperature compensating capacitor interconnecting said anode and said cathode, one of said fixed compensating capacitors compensating for temperature changes over the lower portion of said predetermined frequency range and the other of said compensating capacitors compensating for temperature changes over the upper portion of said predetermined frequency range.

6. A temperature compensated variable frequency oscillator tunable over a predetermined frequency range, comprising an oscillator tube having a cathode and an anode and a control grid, a variable frequency tuned series circuit including an inductance and a main tuning capacitance tunable over said predetermined frequency range and a compensating capacitance, said inductance and said capacitances being connected in series in the order named between said anode and said cathode to form an oscillator circuit, a coupling capacitance connecting said control grid to the junction between said tuning capacitance and said compensating capacitance, the frequency of said oscillator circuit normally decreasing when the temperature of the components thereof increases, a first fixed temperature compensating capacitor connected in parallel with said main tuning capacitance in said tuned circuit, and a second fixed temperature compensating capacitor interconnecting said anode and said cathode, each of said fixed temperature compensating capacitors having a negative temperature coefficient of capacity, said first fixed temperature compensating capacitor compensating for temperature changes over the upper portion of said predetermined frequency range and said second fixed compensating capacitor compensating for temperature changes over the lower portion of said predetermined frequency range.

References Cited in the file of this patent

UNITED STATES PATENTS 2,231,389 Koffyberg ---------------- Feb. 11, 1941